United States Patent
Zang et al.

(10) Patent No.: US 12,154,919 B2
(45) Date of Patent: Nov. 26, 2024

(54) UNIFORM THRESHOLD VOLTAGE NON-PLANAR TRANSISTORS

(71) Applicant: OMNIVISION TECHNOLOGIES, INC., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 188 days.

(21) Appl. No.: 17/326,103

(22) Filed: May 20, 2021

(65) Prior Publication Data
US 2022/0375977 A1 Nov. 24, 2022

(51) Int. Cl.
| | | |
|---|---|---|
| *H01L 27/146* | (2006.01) | |
| *H01L 29/06* | (2006.01) | |
| *H01L 29/78* | (2006.01) | |
| *H01L 29/10* | (2006.01) | |

(52) U.S. Cl.
CPC .. *H01L 27/14616* (2013.01); *H01L 27/14603* (2013.01); *H01L 27/14612* (2013.01); *H01L 27/14614* (2013.01); *H01L 29/785* (2013.01); *H01L 29/1079* (2013.01)

(58) Field of Classification Search
CPC ......... H01L 27/14612; H01L 27/14616; H01L 29/1079; H01L 29/66537; H01L 29/785
See application file for complete search history.

(56) References Cited

U.S. PATENT DOCUMENTS

| | | | |
|---|---|---|---|
| 8,674,413 B1* | 3/2014 | Chi | ................. H01L 21/823821 257/213 |
| 9,570,318 B1 | 2/2017 | Cho et al. | |
| 2011/0309447 A1* | 12/2011 | Arghavani | ........ H01L 21/82345 257/E27.06 |
| 2015/0214314 A1 | 7/2015 | Oh | |
| 2016/0056201 A1* | 2/2016 | Yamashita | .......... H01L 27/1464 257/292 |
| 2019/0393320 A1 | 12/2019 | Yoo et al. | |
| 2020/0176581 A1 | 6/2020 | Lee et al. | |
| 2021/0074593 A1 | 3/2021 | Savant et al. | |

FOREIGN PATENT DOCUMENTS

| | | |
|---|---|---|
| CN | 110649021 A | 1/2020 |
| CN | 112447830 A | 3/2021 |
| WO | 2016179113 A1 | 11/2016 |

OTHER PUBLICATIONS

Chinese Office Action mailed May 12, 2023, issued in related Chinese Application No. 202210135967.5 filed Feb. 15, 2022, 6 pages.

* cited by examiner

*Primary Examiner* — Herve-Louis Y Assouman
*Assistant Examiner* — Christopher M Roland
(74) *Attorney, Agent, or Firm* — Christensen O'Connor Johnson Kindness PLLC

(57) ABSTRACT

Transistors having nonplanar electron channels in the channel width plane have one or more features that cause the different parts of the nonplanar electron channel to turn on at substantially the same threshold voltage. Advantageously, such transistors have substantially uniform threshold voltage across the nonplanar electron channel. Devices, image sensors, and pixels incorporating such transistors are also provided, in addition to methods of manufacturing the same.

21 Claims, 13 Drawing Sheets

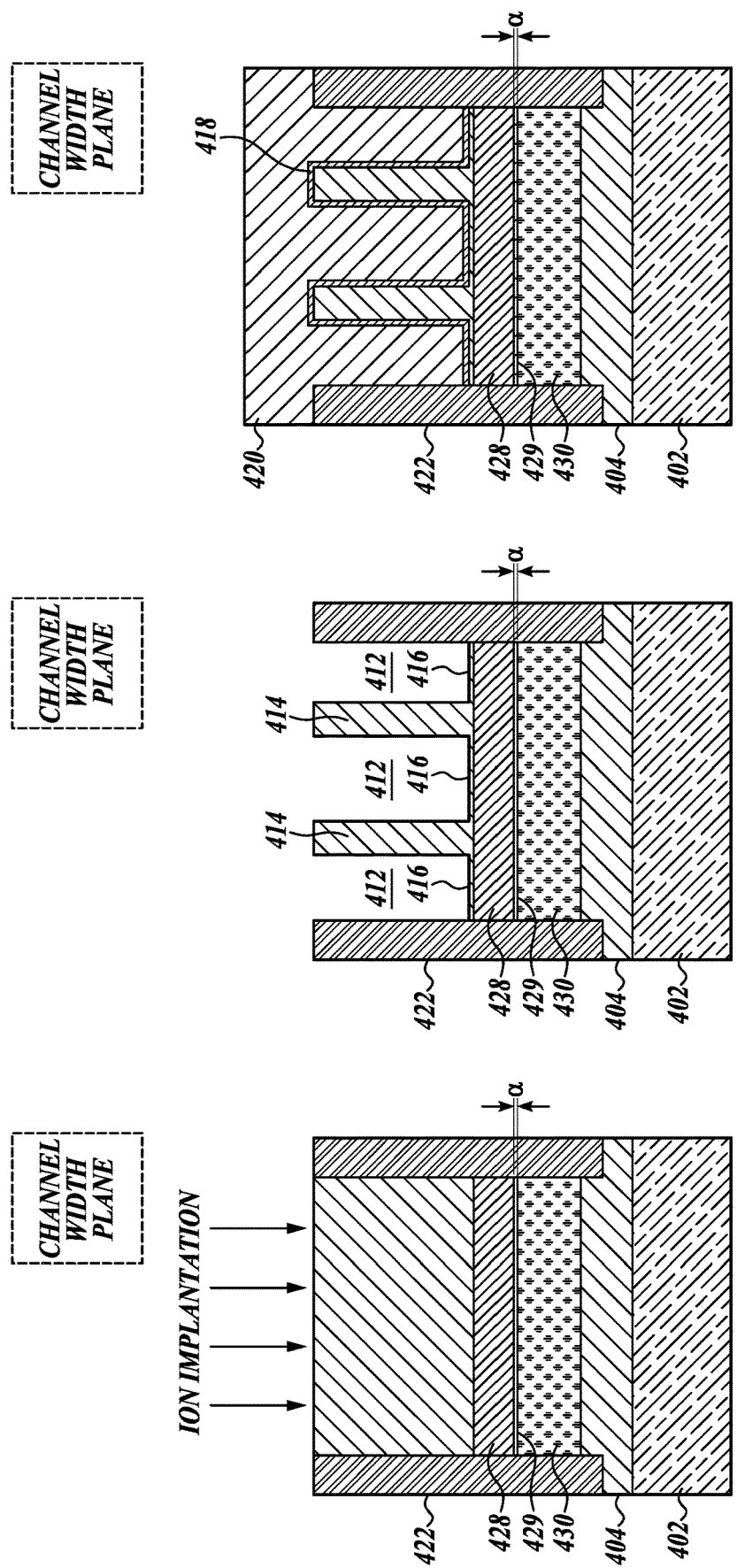

UNIFORM THRESHOLD VOLTAGE NON-PLANAR TRANSISTORS

BACKGROUND

This disclosure relates generally to image sensors, and in particular but not exclusively, source followers for image sensors, and methods of manufacturing source follower transistors for image sensors.

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices. These trends have also contributed to increasing pixel counts.

In image sensors, as the pixel count increases, the bitline setting time also increases due to higher bitline loading. To maintain a high frame rate operation, the transconductance (Gm) of the image sensor source follower transistor can be increased by shortening a length of the source follower channel and/or by increasing a width of the source follower channel. Similarly, the transconductance (Gm) of the image sensor row select transistor can be increased by shortening a length of the row select channel and/or by increasing a width of the row select channel. However, shortening the source follower channel length and/or the row select channel length can lead to deleterious effects, for example short channel effects and undesirable noise, e.g., Random Telegraph Signal (RTS). Widening the source follower channel width and/or the row select channel width can lead to undesirable increases in pixel size.

When the transistor (e.g., the source follower transistor) has a nonplanar structure in a channel width plane forming a nonplanar electron channel, different parts of the electron channel at different depths may have different threshold voltages. This causes different parts of the electron channel to turn on at different times.

BRIEF DESCRIPTION OF THE SEVERAL VIEWS OF THE DRAWINGS

Non-limiting and non-exhaustive embodiments of the present disclosure are described with reference to the following figures, wherein like reference numerals refer to like parts throughout the various views unless otherwise specified.

FIG. 4A shows a first portion of a method of fabricating a transistor in accordance with the teachings of the present disclosure.

FIG. 4B shows a second portion of a method of fabricating a transistor in accordance with the teachings of the present disclosure.

FIG. 4C shows a third portion of a method of fabricating a transistor in accordance with the teachings of the present disclosure.

Figure 1:
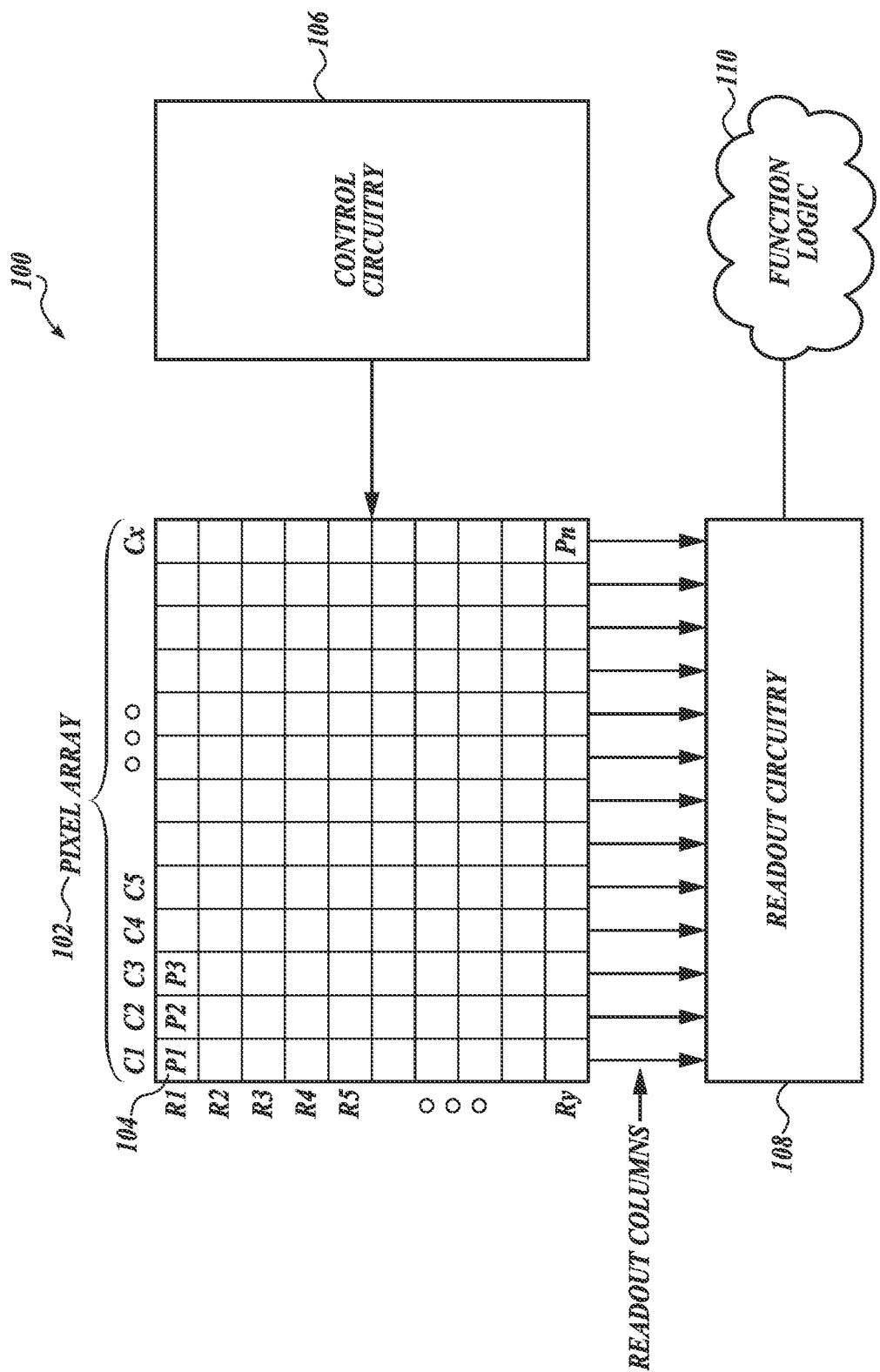
FIG. 1 is a block diagram illustrating an embodiment of an image sensor in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

The present disclosure provides image sensors, devices, and methods for manufacturing image sensors. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "an embodiment" or "some embodiments" means that a particular feature, structure, or characteristic described in connection with the embodiment is included in at least one embodiment of the present invention. Thus, the appearances of the phrases "In some embodiments" or "in an embodiment" in various places throughout this specification are not necessarily all referring to the same example. Furthermore, any particular features, structures, and/or characteristics of any embodiments may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The present disclosure also provides transistors for image sensors, for example source follower transistors, reset transistors, and row select transistors. To facilitate understanding, the present disclosure describes such transistors in the context of complementary metal-oxide-semiconductor ("CMOS") image sensors. However, it shall be appreciated that the present disclosure shall not be limited to transistors for CMOS image sensors, but may be applied to non-CMOS image sensors. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

In the present disclosure, the terms "semiconductor substrate" or "substrate" refer to any type of substrate used for forming semiconductor devices thereon, including single crystal substrates, semiconductor on insulator (SOI) substrates, doped silicon bulk substrate, and epitaxial film on semiconductor (EPI) substrates and the like. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

This disclosure refers to a number of terms with respect to different embodiments (including apparatuses and methods). Terms having alike names have alike meanings with respect to different embodiments, except where expressly noted. Similarly, this disclosure utilizes a number of terms of art. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

The present disclosure provides transistors having nonplanar electron channels in the channel width plane, the transistors having one or more features that cause the different parts of the nonplanar electron channel to turn on at substantially the same threshold voltage. In other words, the transistors having substantially uniform threshold voltage across the nonplanar electron channel. Although the inventive transistor structures are generally described in the context of source followers, the inventive structures are equally applicable to row select transistors, reset transistors, and other image sensor transistors. The present disclosure also provides image sensors and electronic devices equipped with such transistors.

FIG. 1 is a diagram illustrating one example of a representative image sensor 100 with a pixel array 102 of pixel 104. As shown, the pixel array 102 is coupled to a control circuitry 106 and to a readout circuitry 108, which is coupled to a function logic 110.

Pixel array 102 is a two-dimensional ("2D") array of pixels 104 (e.g., pixels P1, P2 . . . , Pn). In one embodiment, each pixel 104 is a complementary metal-oxide-semiconductor ("CMOS") imaging pixel. Pixel array 102 may be implemented as either a front side illuminated image sensor array, or a backside illuminated image sensor array. In some embodiments, pixels 104 include one or more transistors as described below, including source follower transistors, row select transistors, and reset transistors. As illustrated, the pixels 104 are arranged into rows (e.g., rows R1 to Ry) and columns (e.g., column C1 to Cx) to acquire image data of a person, place, or object, which can then be used to render a 2D image of the person, place, or object.

After a pixel 104 has acquired its image data or image charge, the image data is readout by readout circuitry 108 and transferred to function logic 110. Readout circuitry 108 may include amplification circuitry, e.g., a differential amplifier circuitry, analog-to-digital ("ADC") conversion circuitry, or otherwise. In some embodiments, the readout circuitry 108 may readout a row of image data at a time along readout column lines (illustrated) or may readout the image data using a variety of other techniques (not illustrated), such as a serial readout or a full parallel readout of all pixels simultaneously.

Control circuitry 106 is coupled to pixels 104 and includes logic and memory for controlling operational characteristics of pixels 104. For example, control circuitry 106 may generate a shutter signal for controlling image acquisition. In some embodiments, the shutter signal is a global shutter signal for simultaneously enabling all pixels 104 to simultaneously capture their respective image data during a single acquisition window. In some embodiments, the shutter signal is a rolling shutter signal whereby each row, column, or group of pixels 104 is sequentially enabled during consecutive acquisition windows.

Function logic 110 includes logic and memory for storing the image data or even manipulating the image data by applying post image effects (e.g., crop, rotate, remove red eye, adjust brightness, adjust contrast, or otherwise).

Figure 2A:
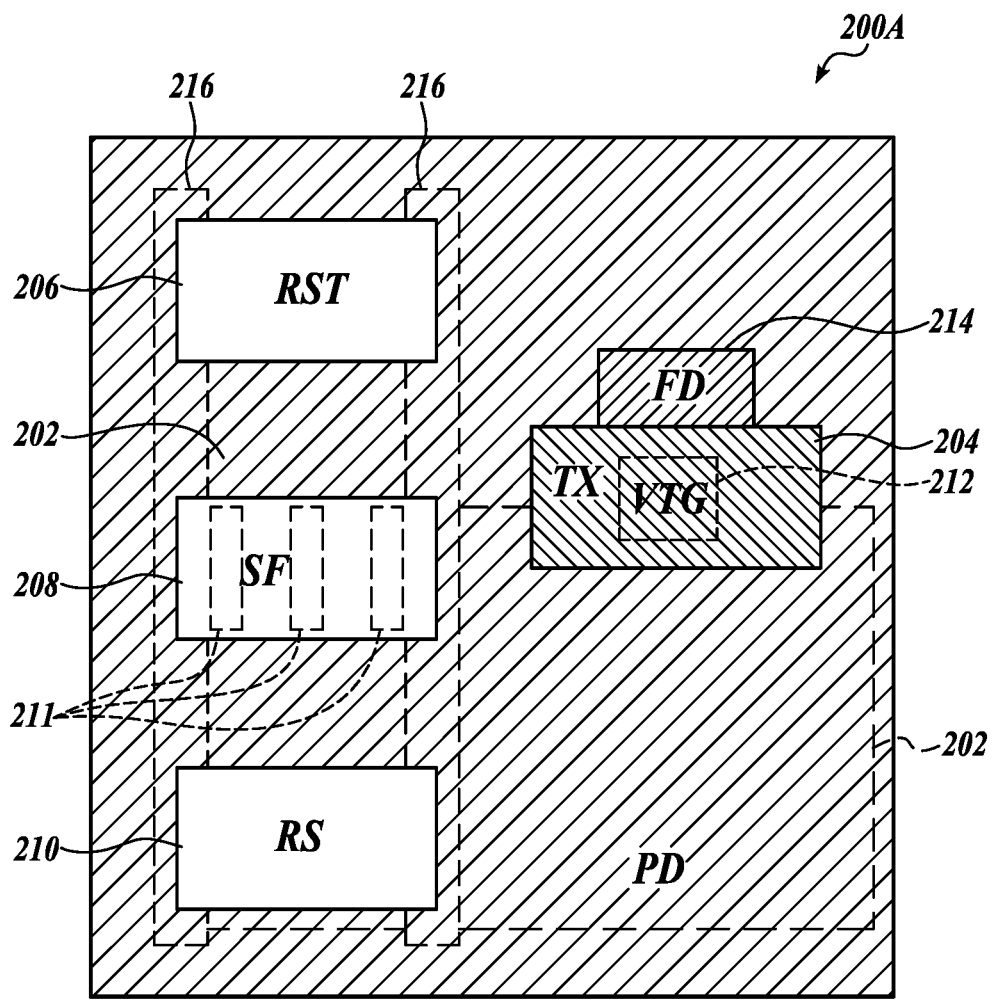
FIG. 2A shows an embodiment of a layout of a pixel in accordance with the teachings of the present disclosure.
Figure 2B:
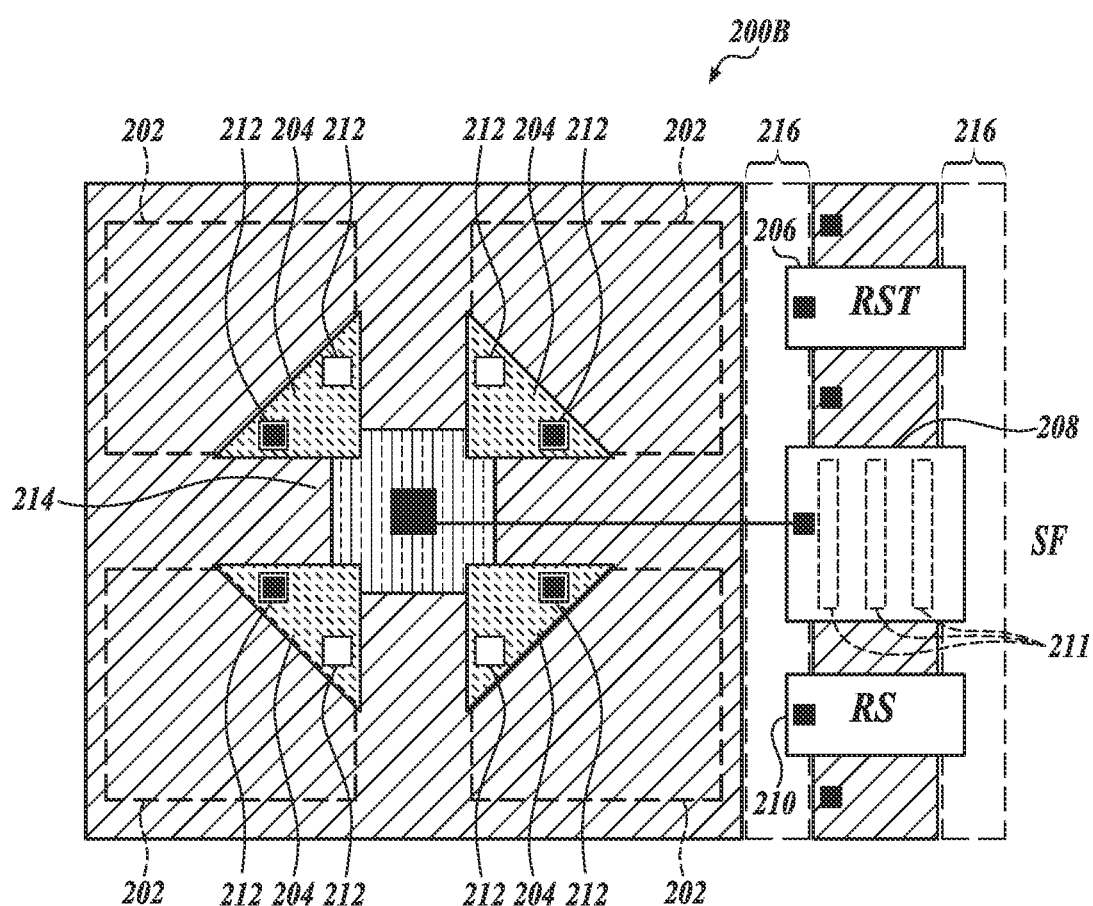
FIG. 2B shows an embodiment of a layout of another pixel in accordance with the teachings of the present disclosure.
Figure 2C:
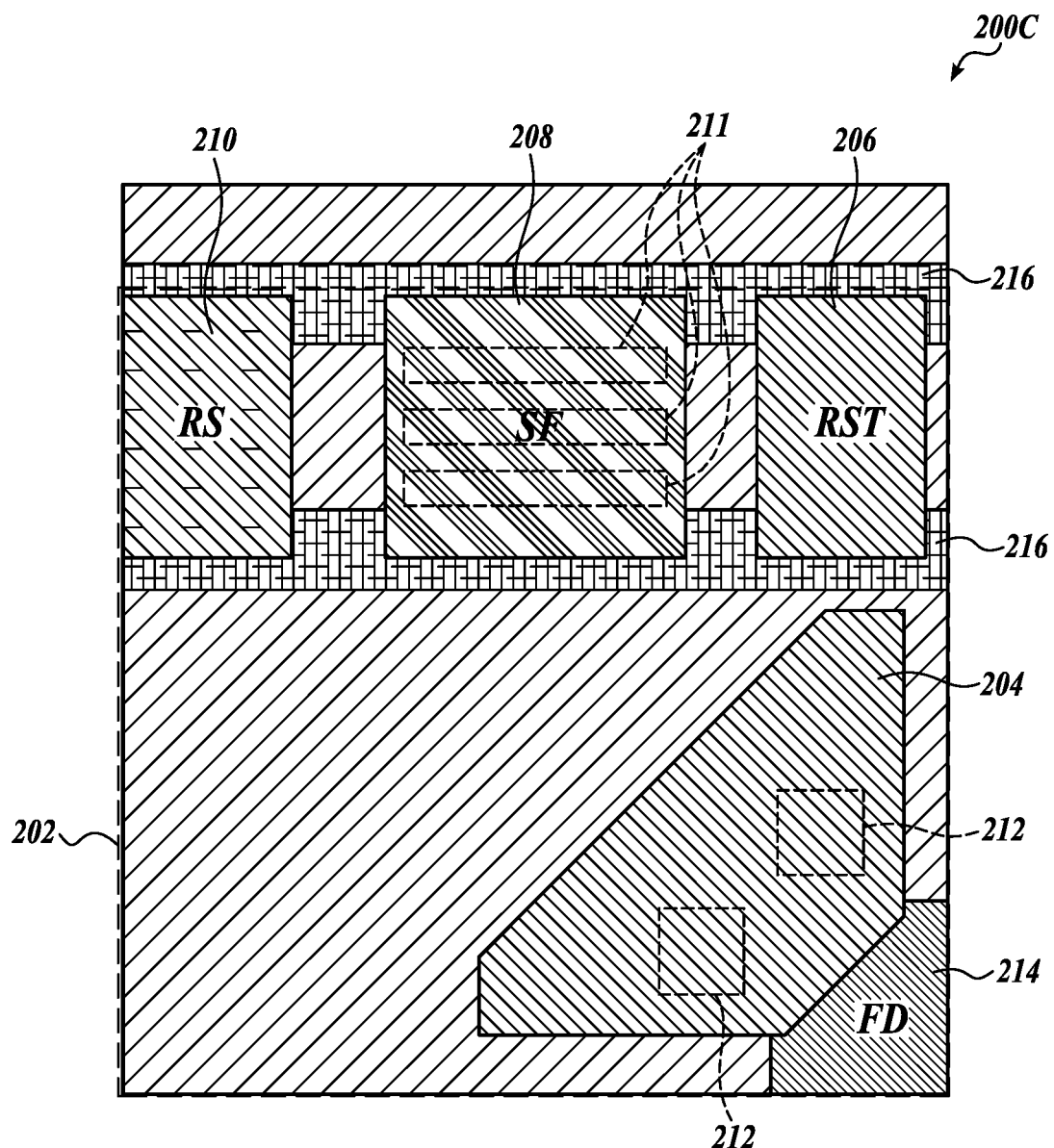
FIG. 2C shows an embodiment of a layout of yet another pixel in accordance with the teachings of the present disclosure.

FIGS. 2A-2C provide representative pixels, which incorporate one or more of the inventive transistors described herein. For clarity, the inventive transistors can be utilized in many additional pixel configurations and are not limited to any particular pixel configuration.

FIG. 2A shows one representative example of a layout of a simplified pixel 200A, which may be utilized in an image sensor such as the image sensor 100 of FIG. 1, which itself may be integrated into an electronic device such as a smart phone. The pixel layout shown in FIG. 2A is representative, and the teachings of the present disclosure may be embodied in many other pixel layouts, for example the layouts of FIGS. 2B and 2C.

The pixel 200A has at least one photodiode 202, at least one transfer transistor 204 having a vertical transfer gate 212 that transfers charge from the photodiode 202 to a floating diffusion region 214, and in turn a source follower transistor 208 coupled to the floating diffusion region 214, a reset transistor 206, and a row select transistor 210.

The floating diffusion 214 is coupled to a transfer gate having of transfer transistor 204 vertical transfer gate 212 and a gate of source follower transistor 208, and operates to aggregate charge carriers from photodiodes 202 (via one or more transfer transistors 204) and to output a corresponding voltage to the gate of source follower transistor 208 for signal read out.

Photodiode 202 is configured to generate and accumulate charges in response to incoming light received during an integration period of the image sensor. Charges, e.g., photoelectrons, accumulated in a charge accumulation region of photodiode 202 (e.g., a source of transfer transistor 204), for example during the integration period of an image sensor, can be selectively transferred to the floating diffusion 214 (e.g., drain of transfer transistor 204) during the charge transfer period of the image sensor depending on voltage applied to a gate of transfer transistor 204. In some embodiments, the photodiodes 202 have a pinned photodiode configuration.

The reset transistor 206 is configured to reset (e.g., discharge or charge) coupled photodiode 202 and the floating diffusion to a preset voltage e.g., a supply voltage $V_{DD}$, via transfer transistor 204 under control of a reset signal received at the gate of reset transistor 206 during a reset period.

The source follower transistor 208 is coupled between a power line and the row select transistor 210, and modulates the image signal output based on the voltage output by floating diffusion 214, where the image signal corresponds to the amount photoelectrons accumulated in charge accumulation region of coupled photodiode 202 during the integration period at the gate thereof. The source follower transistor 208 is configured to amplify the image signal based upon a voltage received at the gate thereof. In known source follower transistors and other transistors having nonplanar geometries (including in a channel width plane), the threshold voltage $V_T$ can vary across the transistor, causing certain portions of the electron channel to turn on before other portions. In turn, this increases the threshold voltage $V_T$ necessary to turn on the entire electron channel, which increases power consumption, slows turn on time, and generally reduces device performance (e.g., lower operation speed).

As described below in detail, the present disclosure provides transistor structures that enable the source follower transistor to have a uniform threshold voltage $V_T$ across gate, which has a planar portion and nonplanar portions 211, such that all portions of the electron channel turn on simultaneously. While generally described in the context of source follower transistors in this disclosure, the teachings of the present disclosure apply to other transistors, e.g., row select transistors, reset transistors, and the like. A transistor with uniform threshold voltage $V_T$ as described below reduces power consumption, reduces turn on time, and improves device performance, e.g., operation speed, thereby facilitating faster read out.

Returning to FIG. 2A, the row select transistor 210 selectively couples the output of the source follower transistor 208 (e.g., image signal) to the readout column line through the row select transistor 210 under control of a row select signal.

The region where reset transistor 206, source follower transistor 208, and row select transistor 210 are disposed can be referred to as a device transistor area of the pixel 200A, which is isolated from the transfer transistor 204 and photodiode 202 by isolation structures 216 (e.g., shallow channel isolation trench structures having a depth of 150 nm-400 nm with respect to a front side of the semiconductor substrate 202), which in some embodiments form part of the inventive transistors described below.

In some embodiments, the pixel 200A may include additional elements that are not described in detail herein, such as one or more additional transistors, capacitors, floating diffusions, or the like. In the illustrated example, the pixel 200A includes a single photodiode; however, some embodiments include a plurality of photodiodes, e.g., sharing a common floating diffusion, a common source follower transistor, a common reset transistor and a common row select transistor. In some embodiments, the pixel 200A includes one photodiode associated with a floating diffusion and pixel transistors such as a source follower transistor, reset transistor, and row select transistor. In some embodiments, the transfer gate of the transfer transistor 204 utilizes planar transfer gate (without vertical transfer gate 212).

In operation, during the integration period of the image sensor (also referred to as an exposure or accumulation period), photodiode 202 absorbs incident light on its charge accumulation region. The photogenerated charge accumulated in the charge accumulation region of the photodiode 202 is indicative of the amount of incident light incident onto its charge accumulation region. After the integration period, a transfer signal (e.g., a positive biasing voltage) applied, for example from the control circuitry 106 of FIG. 1, to the vertical transfer gate 212 of transfer transistor 204 causes the transfer transistor 204 to turn on and transfer the photogenerated charge from coupled photodiode 202 to the floating diffusion 214 during the charge transfer period. The source follower transistor 208 operatively generates the image signal based on voltage outputted by the coupled floating diffusion 214. The row select transistor 210 coupled to the source follower transistor 208 then selectively couples the image signal onto a column bit line upon receiving a row select signal during a read out period for subsequent image processing.

In some embodiments, the pixel 200A includes additional elements that are not described in detail herein, such as one or more additional photodiodes, transistors, power lines, floating diffusions, etc. The present disclosure generally relates to source follower transistors such as source follower transistor 208. For example, the present disclosure provides source follower transistors and other transistors having a uniform threshold voltage $V_T$. However, the skilled artisan will appreciate that the present disclosure is not limited to source follower transistors. Rather, the teachings of the present disclosure can be utilized to normalize the threshold voltage $V_T$ of other transistors, for example transistors, in particular transistors having nonplanar geometries in the channel width plane, such as may be utilized to achieve higher transconductance.

FIG. 2B shows a layout of another representative pixel 200B, which has similar structure and function as pixel 200A of FIG. 2A except where described below. For example, pixel 200B of FIG. 2B has a plurality of photodiodes 202, a plurality of transfer transistors 204 that operatively transfer charge from the respective photodiodes 202 to shared floating diffusions 214. The illustrated pixel 200B can be referred to as a "four-shared" pixel, and further includes a reset transistor 206, a source follower transistor 208, and a row select transistor 210 operatively connected to the photodiodes 202 via the transfer transistors 204 and floating diffusions 214.

In some embodiments, each transfer transistor 204 employs a transfer gate with dual vertical gate electrodes (e.g., vertical transfer gates 212) for selectively transferring photogenerated charges from corresponding photodiode 202 to the shared floating diffusion 214 through a vertical electron channel.

The floating diffusion 214 is coupled to a gate of the source follower transistor 208, which is coupled between a power line and the row select transistor 210.

The reset transistor 206 is coupled between a power line (not shown) and the floating diffusions 214 to reset (e.g., discharge or charge) the floating diffusions 214 to a preset voltage (e.g., a supply voltage $V_{DD}$) under control of a reset signal RST during a reset or pre-charge period. The reset transistor 206 is further coupled to photodiodes 202 through the corresponding transfer transistors 204 to selectively reset photodiodes 202 to the preset voltage during the reset or pre-charge period.

The source follower transistor 208 operates to modulate the image signal output based on the voltage of floating diffusions 214 received at the gate of the source follower transistor 208, where the image signal corresponds to the amount photoelectrons accumulated in photodiodes 202 in response to amount of incident light absorbed during the integration period.

The row select transistor 210 selectively couples the output (e.g., image signal) of the source follower transistor 208 to the readout column line under control of a row select signal RS. Row select transistor includes a plurality of nonplanar portions 211, which are described below.

In the illustrated example, the device transistor area that includes the reset transistor 206, source follower transistor 208, and row select transistor 210 is electrically isolated by isolation structures 216 from the pixel area that includes one or more photodiodes 202, transfer transistors 204, and floating diffusions 214. In the illustrated embodiments, isolation structures 216 are trench structures, e.g., shallow trench isolation structures.

FIG. 2C shows a layout of yet another representative pixel 200C, which has similar structure and function as the pixels 200A and 200B of FIG. 2A and FIG. 2B except where described below. For example, the orientation of device transistor area is in a horizontal manner with respect to photodiode 202 and at least a portion of the placement of device transistor area in pixel 200C of FIG. 2C is above photodiode 202. The device transistor area is isolated by isolation structures 216 from the photodiodes 202 and transfer transistor 204 in the active area.

The inventive transistors described herein can be utilized in any of the pixels described above, and in many additional pixel configurations, and are not limited to any particular pixel configuration.

Figure 3A:
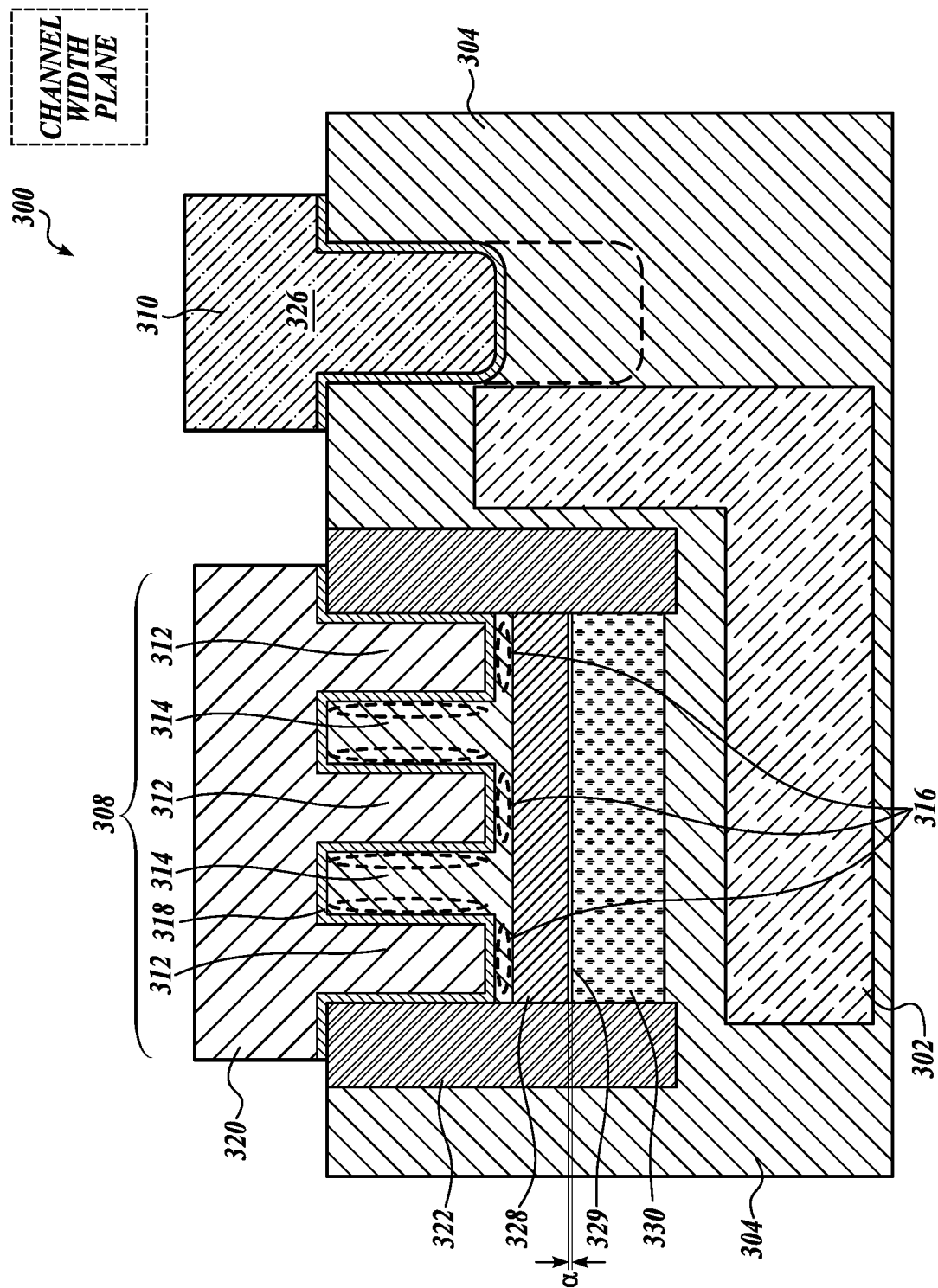
FIG. 3A shows a cross section of one embodiment of a pixel in accordance with the teachings of the present disclosure.

FIG. 3A shows a section view of a representative pixel 300 according to one representative embodiment of the present disclosure. The pixel 300 has a similar pixel layout as the pixel 200A of FIG. 2A. For example, the pixel 300 is part of an image sensor (e.g., the image sensor 100 of FIG. 1) that includes a photodiode 302 disposed in a semiconductor substrate 304 below a device transistor area that includes a number of transistors, including a source follower transistor 308.

The photodiode 302 absorbs incident light on its charge accumulation region. The photogenerated charge accumulated in the charge accumulation region of the photodiode 302 is indicative of the amount of incident light. After the integration period, a vertical transfer gate 326 of the transfer transistor 310 receives a transfer signal (e.g., a positive biasing voltage), forming a conduction channel transferring the photogenerated charge from coupled photodiode 302 to a respective coupled floating diffusion (not shown). In some embodiments, the vertical transfer gate 326 has a depth of 300 nm-500 nm with respect to a front side of the semiconductor substrate 304.

The semiconductor substrate 304 is a silicon substrate, a silicon on insulator substrate, or the like having one or more doped portions, such as N-type doped silicon portions and/or P-type doped silicon portions. The source follower transistor 308 of FIG. 3A is an N-type transistor, and accordingly FIG. 3A shows a P-type well portion of the semiconductor substrate 304.

The section view of FIG. 3A is taken in a channel width plane through the source follower transistor 308. For clarity, the "channel width plane" is a plane extending across an electron channel through which electrons flow between a source and a drain (e.g., into/out of the page). In other words, the channel width plane of FIG. 3A is perpendicular to the direction of current flow. By comparison, a channel length plane is oriented into/out of the page, i.e., perpendicular to the channel width plane and parallel to the direction of current flow.

Figure 3B:
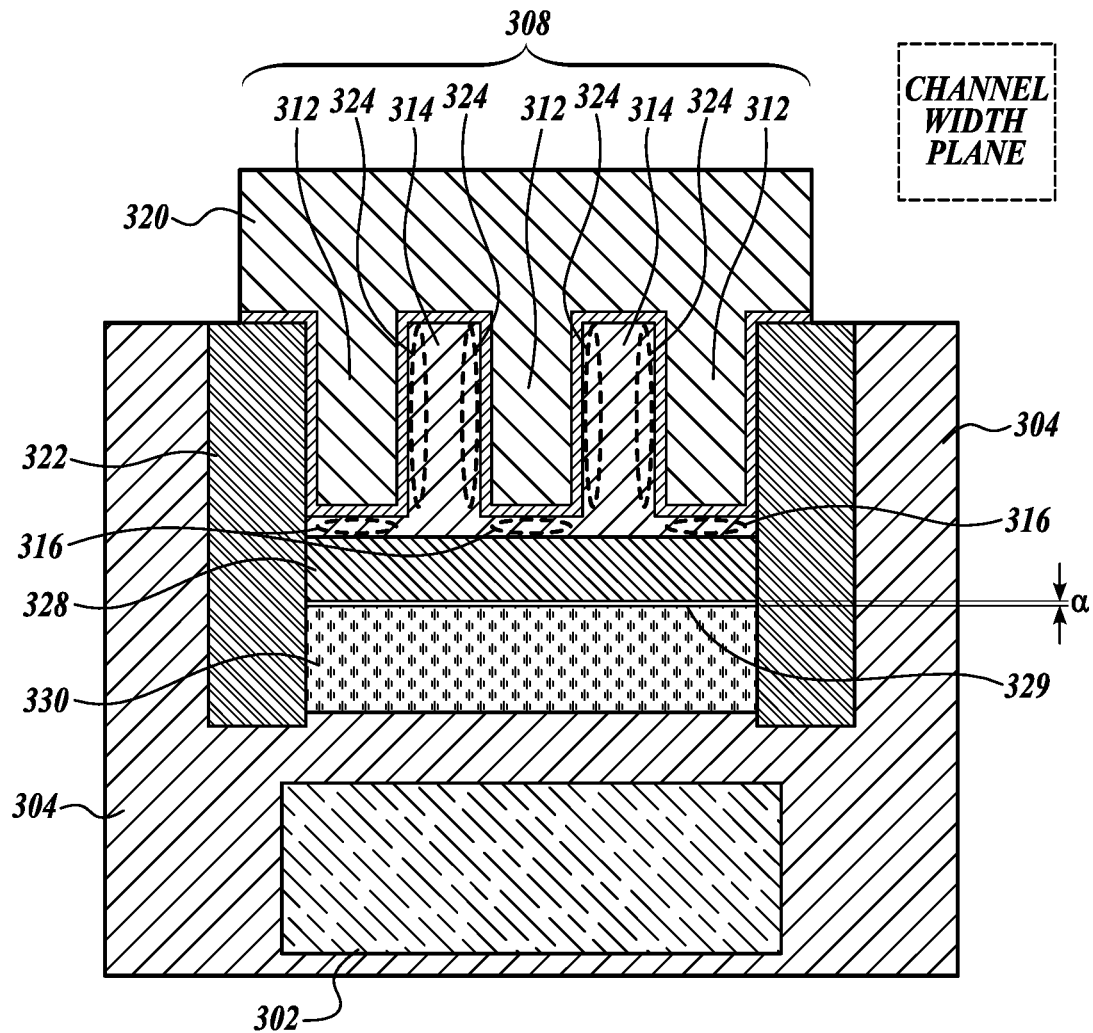
FIG. 3B shows a cross section of one embodiment of a source follower transistor in accordance with the teachings of the present disclosure.

The source follower transistor 308 forms part of the device transistor area of the pixel 300, which in some embodiments includes a reset transistor, a row select transistor, and/or other transistors not shown in FIG. 3A. See, e.g., FIG. 2A. Although FIG. 3A shows a source follower transistor, the structure shown therein and described below with respect to FIG. 3B is applicable to other transistors, e.g., a reset transistor and a row select transistor. As described in detail below, the source follower transistor 308 has a structure that enables a uniform threshold voltage across the electron channel.

Turning to the section view of FIG. 3B, details of the source follower transistor 308 will now be described.

The source follower transistor 308 is nonplanar, i.e., has a nonplanar electron channel when viewed in the channel width plane. That is, a plurality of trenches 312 formed in the semiconductor substrate 304 (each having a depth of 100 nm-500 nm with respect to a front side of semiconductor substrate 304) define a plurality of nonplanar structures 314 (e.g., "fins") which are spaced apart by a plurality of base portions 316 of the semiconductor substrate 304. In some embodiments, the trenches 312 have a common depth as the vertical transfer gate 326, which advantageously enables fabrication by enabling etching the trenches 312 and the recess for the vertical transfer gate 326 in a common lithography and etching step. However, in other embodiments (e.g., embodiments in which the trenches 312 and vertical transfer gate 326 recesses are formed in different steps), the vertical transfer gate 326 has a deeper depth than the trenches 312.

An isolation layer 318 is disposed in the plurality of trenches 312, on the nonplanar structures 314, and on the base portions 316, and separates the semiconductor substrate 304 from a gate 320. Accordingly, the isolation layer 318 functions as a gate isolation layer, and comprises a dielectric, such as an oxide or high-k material, e.g., a material having a dielectric constant that is greater than about 3.9 (e.g., $Al_2O_3$ or $HfO_2$). The gate 320 is disposed on the isolation layer 318, with parallel and finger-like electrodes ("fingers") extending into the trenches 312. To clarify, trenches 312 refer to the voids formed in the semiconductor substrate 308, and the nonplanar portions or "fingers" of gate 320 (shown as nonplanar portions 211 of FIGS. 2A-2C) occupy the trenches 312. Each "finger" has a "fingertip" portion disposed adjacent one of the base portions 316. In some embodiments, the gate 320 comprises a polysilicon or a metal. Each of the fingers of the gate 320 extend both in the channel width plane and in a channel length direction between a source and a drain. In some embodiments, the fingers of the gate 320 and the vertical transfer gate 326 have a common depth, which enables fabrication during a shared step for cost savings. However, in other embodiments, the vertical transfer gate 326 extends to a deeper depth than the fingers of the gate 320.

Channel isolation structures 322 (distinct from trenches 312) isolate the source follower transistor 308 from the photodiode 302 and other elements of the pixel 300, e.g., the vertical transfer gate 326 and transfer transistor 310 of FIG. 3A. In some embodiments, channel isolation structures 322 are shallow channel isolation trench structures (having a having a depth of 150 nm-400 nm with respect to a front side of the semiconductor substrate 304) filled with an oxide material. In the illustrated embodiment, each channel isolation structure 322 has a first (upper) end that is coplanar with at least one of the nonplanar structures 314, in order to isolate the electron channel. In some embodiments, each channel isolation structure 322 has a second (lower) end opposite to the first end that extends beyond at least one of the nonplanar structures 314 (toward the gate 320) in order to isolate the resulting electron channel from other pixel elements e.g., photodiode 302. Similarly, the second end of each channel isolation structure 322 extends closer to the photodiode 302 (e.g., deeper with respect a front side of semiconductor substrate 304) than a voltage modulation layer 328, described below.

As a result of the structure above, portions of the nonplanar structures 314 and the base portions 316 are configured to form together a nonplanar electron channel (shown as dashed ovals in FIG. 3A) when a voltage is applied to the gate 320. In particular, each nonplanar structure 314 includes sidewall portions 324 disposed along the vertical sidewall surfaces of finger portion of gate 320, which form parallel portions of the electron channel. Likewise, regions of the base portions 316 disposed along the horizontal surfaces thereof form parts of the electron channel underneath the trenches 312 when a voltage is applied to the gate 320. While each sidewall portion 324 and each base portion 316 is configured to form part of the electron channel in the illustrated embodiment, it is possible to selectively dope one or more of the sidewall portions 324 and base portions 316 in order to exclude those portions from the electron channel, e.g., for greater control over the threshold voltage. For example, in the illustrated embodiment, the top/upper part of each nonplanar structure 314 (i.e., the top of the fin) does not form part of the electron channel; however, in some embodiments, the top part does form part of the electron channel, such that each fin provides a 3-sided electron channel.

In known transistors, different threshold voltages are often necessary to "turn on" different portions of the electron channel. For example, application of a voltage to the gate may be sufficient to turn on a first portion of the electron channel, but may be insufficient to turn on other portions of the electron channel. For example, in the context of a fin-type nonplanar transistor, application of a voltage to the gate may turn on the sidewall portions of the electron channel, but not the base portions. This may be true because the base portions are adjacent to a relatively small portion of the gate finger, which has a single side, whereas the fins (i.e., the sidewall portions) are adjacent to a three-sided portion of the gate. Thus, to fully turn on the electron channel of nonplanar transistors (i.e., not the transistors of the present disclosure), it is generally necessary to apply a greater biasing voltage at the gate of the nonplanar transistor than is strictly necessary to turn on certain parts of the electron channel. Because this increases turn-on voltage, consumes more power, and slows device performance, it is undesirable in most applications. Alternatively, application of inadequate voltage to the gate fails to turn on all parts of the electron channel, which is also undesirable.

Figure 5A:
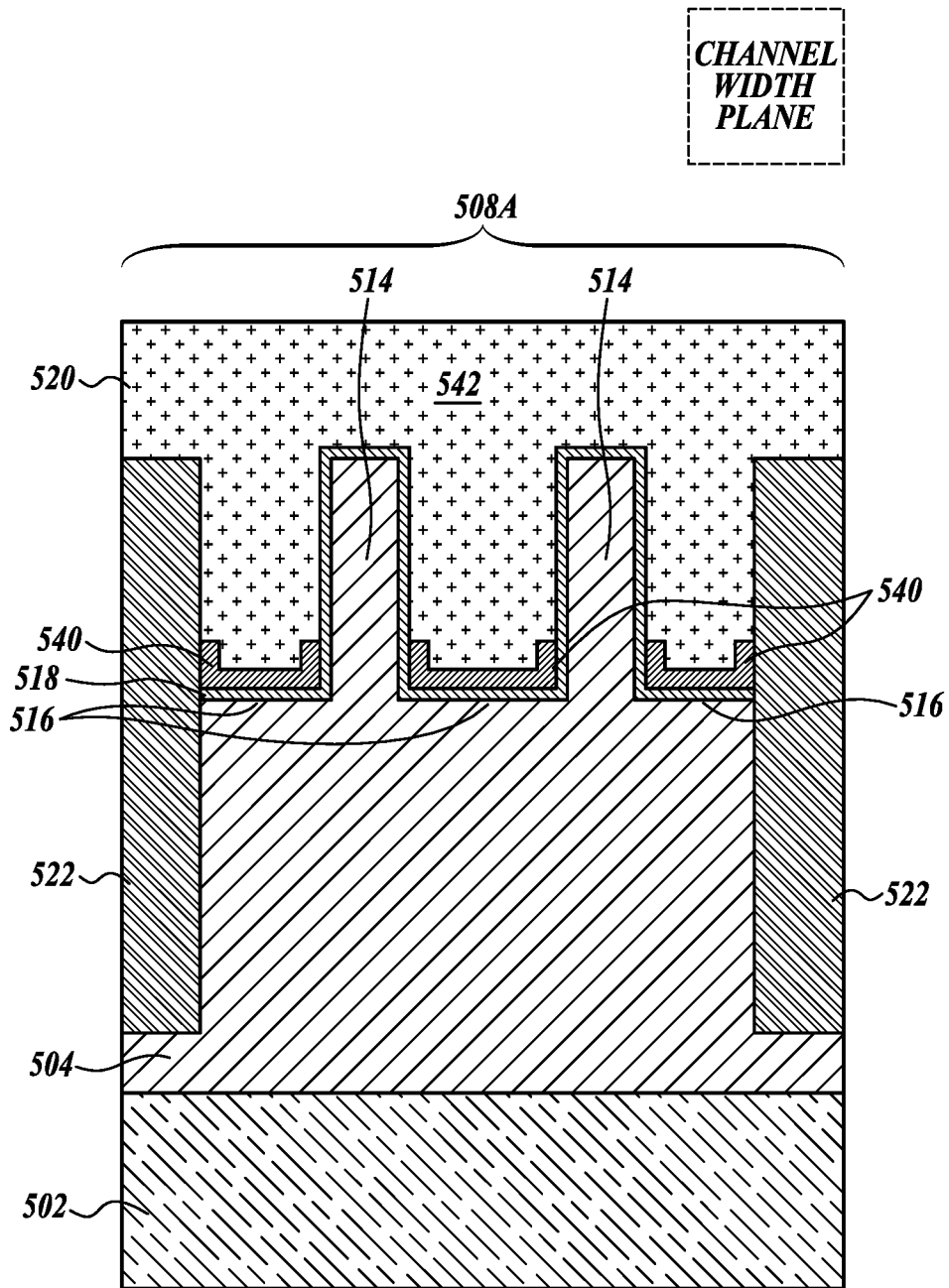
FIG. 5A shows a cross section of another embodiment of a source follower transistor in accordance with the teachings of the present disclosure.
Figure 5B:
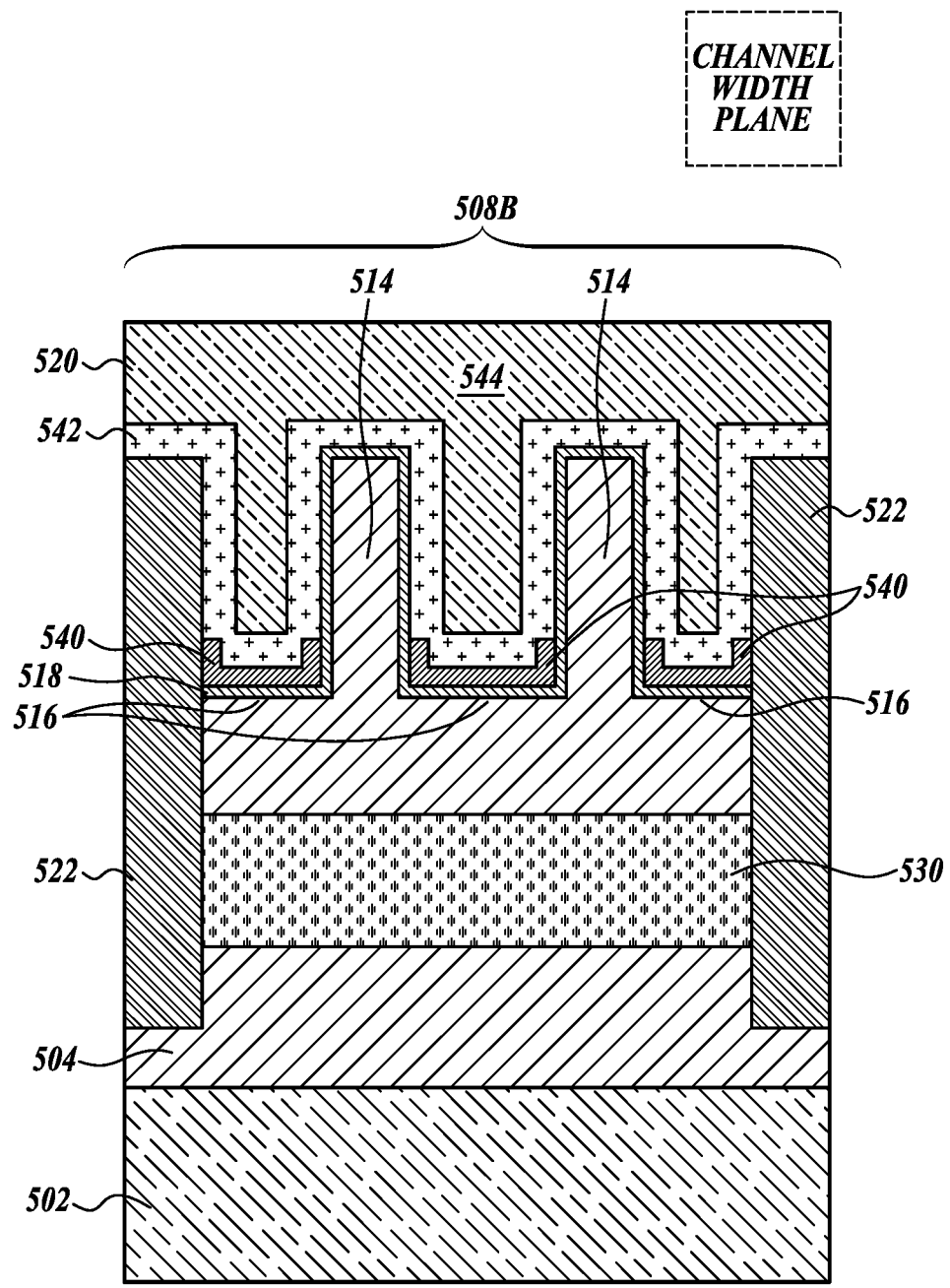
FIG. 5B shows a cross section of still another embodiment of a source follower transistor in accordance with the teachings of the present disclosure.

The innovative transistors of the present disclosure overcome this problem by utilizing different structures to modulate or tune the threshold voltage of different portions of the nonplanar electron channel, such that all portions of the electron channel have approximately the same threshold voltage. FIGS. 3A-3B depict one such type of representative transistor structure, and FIGS. 5A-5B depict another type of representative transistor structure. Restated, the inventive transistors utilize novel structures to reduce the threshold voltage for high-threshold voltage portions of the electron channel and/or increase threshold voltage for low-threshold voltage portions of the electron channel, such that the threshold voltage is normalized for all portions of the electron channel.

The representative source follower transistor 308 of FIGS. 3A-3B modulates the threshold voltage of the base portions 316 of the electron channel using a doped voltage modulation layer 328 formed as a doped portion of the semiconductor substrate 304 beneath the base portions 316 (restated, between the photodiode 302 and the base portions 316, or on an opposite side of the base portions 316 from the plurality of nonplanar structures 314). The source follower transistor 308 is an N-type transistor in this embodiment, and therefore the cross section shown in FIG. 3A is the P-type well portion of the semiconductor substrate 304. In such a context, the voltage modulation layer 328 is a lightly N-type doped portion (a layer) extending in the channel width plane across the base portions 316 (e.g., all base portions 316) and between the channel isolation structures 322. In the channel length direction (into and out of the page), the voltage modulation layer 328 extends between the N-type source and drain of the source follower transistor 308. Arsenic (As) is one representative suitable dopant for the voltage modulation layer 328, although other N-type dopants may be suitable. In one example, the voltage modulation layer 328 produces a threshold voltage modulating effect, i.e., it reduces the threshold voltage of the base portions 316, when the voltage modulation layer 328 has a charge carrier concentration of $1E11/cm^3$-$1E13/cm^3$. A greater charge carrier concentration of the voltage modulation layer 328 undesirably reduces charge carrier mobility and induces white pixel noise.

The voltage modulation layer 328 is spaced apart from the isolation layer 318 (i.e., toward the photodiode 302) by 5-20 nanometers (nm), and has a layer thickness of 0.5 nm-5.0 nm. Thus, by providing a slightly higher concentration of charge carriers adjacent to base portions 316, the voltage modulation layer 328 facilitates movement of free charge carriers at those locations, thus selectively reducing the threshold voltage for the base portions 316. Therefore, the threshold voltage that is sufficient to turn on the sidewall portions 324 is also sufficient to turn on the base portions 316, which advantageously reduces power consumption, and speeds device operation.

An optional passivation layer 330 is another doped layer, which has a layer thickness of 0.5 nm-10 nm, is formed below the voltage modulation layer 328, and laterally extends between the channel isolation structures 322, in order to isolate the electron channel from the photodiode 302, advantageously reducing white pixel noise and other deleterious effects, particularly in buried-photodiode embodiments such as the pixel 300. In the illustrated buried-photodiode embodiment, the passivation layer 330 is disposed between the voltage modulation layer 328 and the photodiode 302. In the illustrated embodiment, the passivation layer 330 is a light-doped p-type doping layer, e.g., a lightly boron-doped layer; however, other p-type dopants with light dosage may be suitable. In some embodiments, the passivation layer 330 is formed directly adjacent to the voltage modulation layer 328. In other embodiments, the passivation layer 330 is spaced apart from the voltage modulation layer 328 by a semiconductor portion 329 having a thickness a between 0.1 nm-10 nm The semiconductor portion 329 has a dopant concentration lower than that of the passivation layer 330 (e.g., close to intrinsic). For example, if the passivation layer 330 is lightly doped with a p-type dopant, then the semiconductor portion may be very lightly doped.

Thus, the source follower transistor 308 of FIGS. 3A and 3B is configured to have a uniform threshold voltage across the nonplanar electron channel. While the voltage modulation layer 328 alone is configured to modulate the threshold voltage of the base portions 316, the characteristics of the isolation layer 318 (e.g., material and thickness), gate 320 (e.g., material), and fins (e.g., dimensions) also modulate the threshold voltage of portions of the electron channel, for example the sidewall portions 324. Thus, it is appreciated that the unobvious combination of gate characteristics, channel geometry, isolation layer characteristics, and voltage modulation layer characteristics described herein contribute to the unexpected result of a uniform threshold voltage across the source follower transistor 308 in accordance with the teachings of the present invention.

Figure 3C:
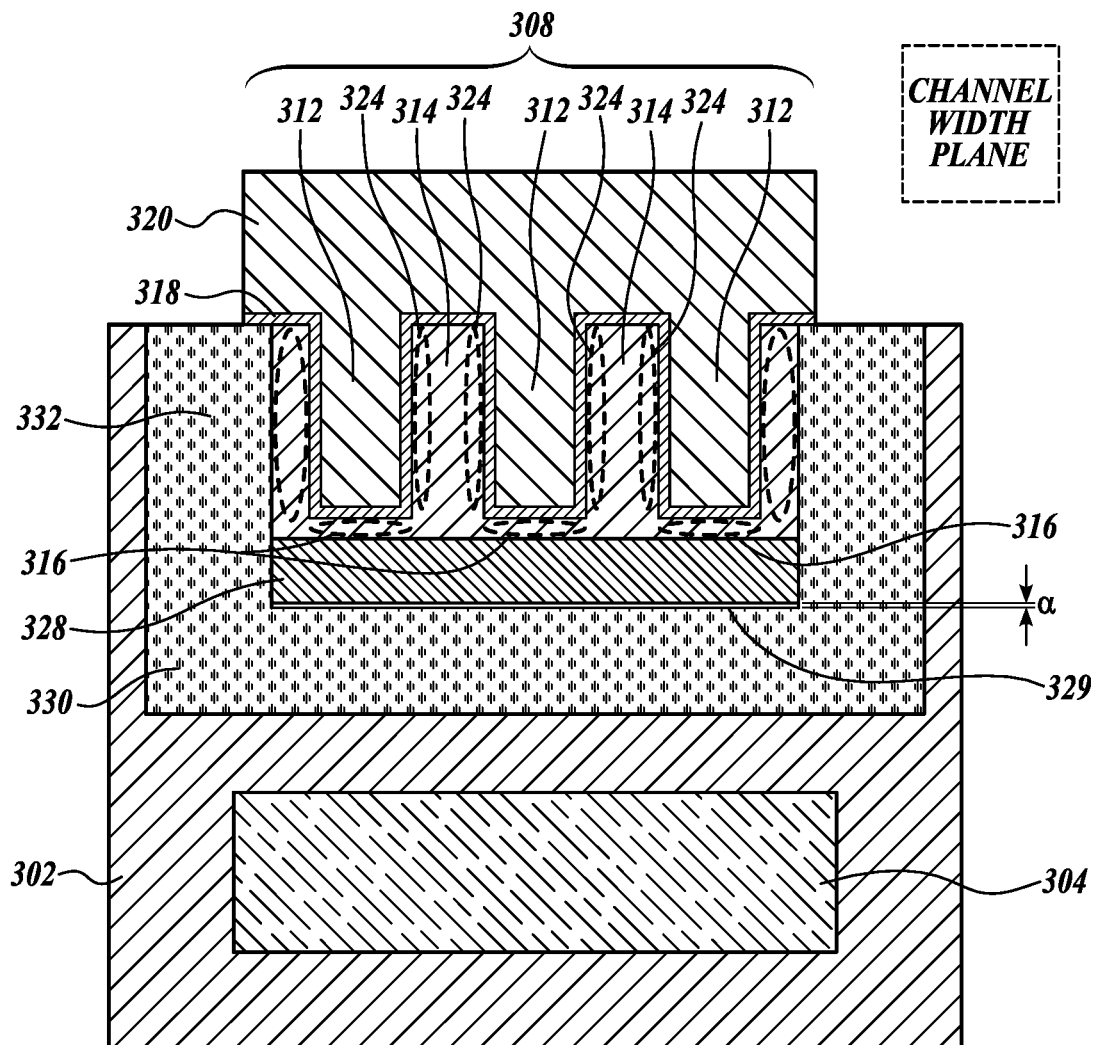
FIG. 3C shows a cross section of another embodiment of a source follower transistor in accordance with the teachings of the present disclosure.

FIG. 3C shows an alternative source follower transistor 308 configured to have a uniform threshold voltage. Except where described below, the source follower transistor 308 is identical to the source follower transistor 308 of FIG. 3A and FIG. 3B; accordingly, alike reference numerals are utilized for clarity and have alike meanings. For clarity and simplicity, the relevant differences are described below.

Unlike the source follower transistor 308 of FIGS. 3A and 3B, the source follower transistor 308 of FIG. 3C does not include channel isolation structures (such as channel isolation structures 322 of FIG. 3A). That is, the source follower transistor 308 of FIG. 3C does not include shallow channel isolation trench structures or the like disposed on either side of the electron channel. Therefore, in order to isolate portions of the electron channel from other pixel elements and to reduce white pixel noise, the passivation layer 330 of FIG. 3C includes vertical isolation portions 332 that extend around the voltage modulation layer 328 in the channel width plane. Restated, the vertical isolation portions 332 extend upward, above the horizontal portion of the passivation layer 330, to the gate 320, where top portions of the vertical isolation portions 332 meet the gate 320 and are coplanar with the isolation layer 318. In this way, the passivation layer 330 and vertical isolation portions 332 surround the voltage modulation layer 328 on three sides. The passivation layer 330 provides junction isolation that electrically isolates the photodiode 302 from the voltage modulation layer 328 and the source follower transistor 308. For additional isolation advantages, the vertical isolation portions 332 may also extend downward, below the horizontal portion of the passivation layer 330, toward the photodiode 302. In embodiments, the passivation layer 330 is grounded.

In some embodiments, the voltage modulation layer 328 is separated from the passivation layer by a semiconductor substrate material portion 329 having dopant concentration lower than that of the passivation layer 330, and with a thickness a between 0.1 nm-10.0 nm, inclusive. For example, if the passivation layer 330 is lightly doped with a p-type dopant such as boron, the semiconductor substrate material portion 329 may have an even lighter doping concentration of p-type dopant.

FIGS. 4A-4C depict one representative method of forming a transistor for an image sensor, such as the source follower transistors of FIGS. 3A-3B, row select transistors, reset transistors, and the like.

In a first step shown in FIG. 4A, a semiconductor substrate 404 is provided, having many of the features described herein. The provided semiconductor substrate 404 may have a photodiode 402 formed therein, e.g., a deep buried photodiode. Otherwise, the photodiode 402 is formed in the semiconductor substrate 404 as part of the first step or in a sequentially next step.

In a second optional step also shown in FIG. 4A, channel isolation structures 422 are formed in the semiconductor substrate 404 on opposite sides of an area that will include nonplanar structures and gate. The channel isolation structures 422 each extend in a channel length direction and have a width in a channel width plane. The channel isolation structures 422 may be formed by etching trenches with a depth of 150-400 nm in the semiconductor substrate 404 with respect to front side of semiconductor substrate 404 and then filling those trenches with dielectric material e.g., oxide to form shallow channel isolation structures.

In a third step shown in FIG. 4A, a voltage modulation layer 428 and optionally a passivation layer 430 are formed in the semiconductor substrate 404. To form the voltage modulation layer 428, a first dopant such as an N-type dopant is implanted into the semiconductor substrate 404 from a front side of semiconductor substrate 404 above the photodiode 402 such that it has a layer thickness of 0.5 nm-5.0 nm, and has a doped area that covers a channel region in a channel width plane and in a channel length direction. In one representative embodiment, the voltage modulation layer 428 is formed by ion implantation of a lightly doped of N-type dopant (e.g., arsenic) into the semiconductor substrate 404. To form the optional passivation layer 430, a second dopant (opposite from the conductive type of first dopant) is implanted into the semiconductor substrate 404 between the voltage modulation layer 428 and the photodiode 402, such that it has a layer thickness of 0.5-10.0 nm, inclusive. In one representative embodiment, a lightly doped of P-type dopant such as boron is implanted into the semiconductor substrate 404 by ion implantation or by diffusing diborane gas. In embodiments having both a voltage modulation layer 428 and a passivation layer 430, the voltage modulation layer 428 may be formed before the passivation layer 430, or vice versa. In embodiments having channel isolation structures 422, the voltage modulation layer 428 and passivation layer 430 are formed in between the channel isolation structures 422. In some embodiments, the passivation layer 430 is formed 0.1 nm-10.0 nm underneath the voltage modulation layer 428, such that a semiconductor substrate material portion 429 separates the two layers.

In a fourth step shown in FIG. 4B, a plurality of trenches 412 are formed in the semiconductor substrate 404 over the voltage modulation layer 428 to form a plurality of nonplanar structures 414 (e.g., fins) and base portions 416. In one representative embodiment, the trenches 412 are formed using etching and/or photolithography techniques.

In a fifth step shown in FIG. 4C, an isolation layer 418 is formed by depositing a dielectric, such as an oxide or high-k material, forming a gate dielectric layer on the nonplanar structures 414 and base portions 416 formed in the previous step.

In a sixth step also shown in FIG. 4C, a gate 420 having a plurality of fingers is formed on the isolation layer 418, e.g., by depositing a polysilicon or a metal into the previously-formed trenches 412.

Figure 4F:
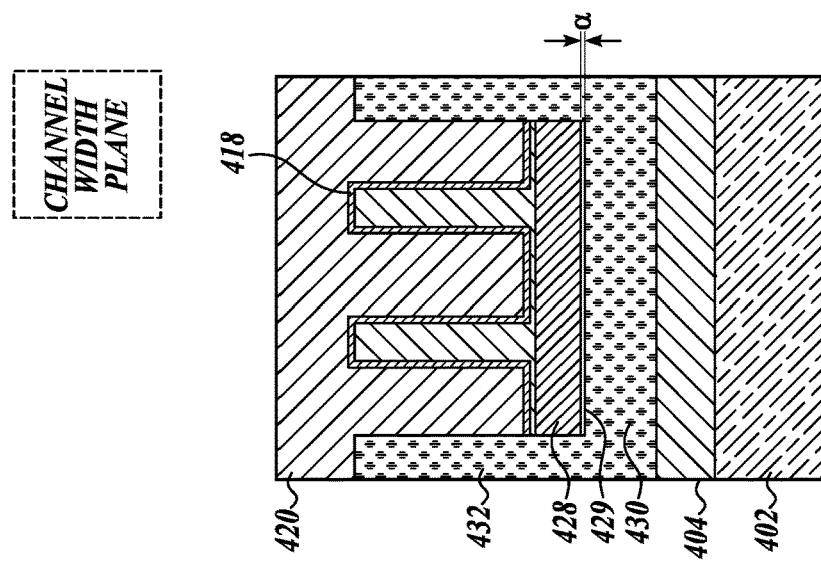
FIG. 4F shows a third portion of another method of fabricating a transistor in accordance with the teachings of the present disclosure.
Figure 4E:
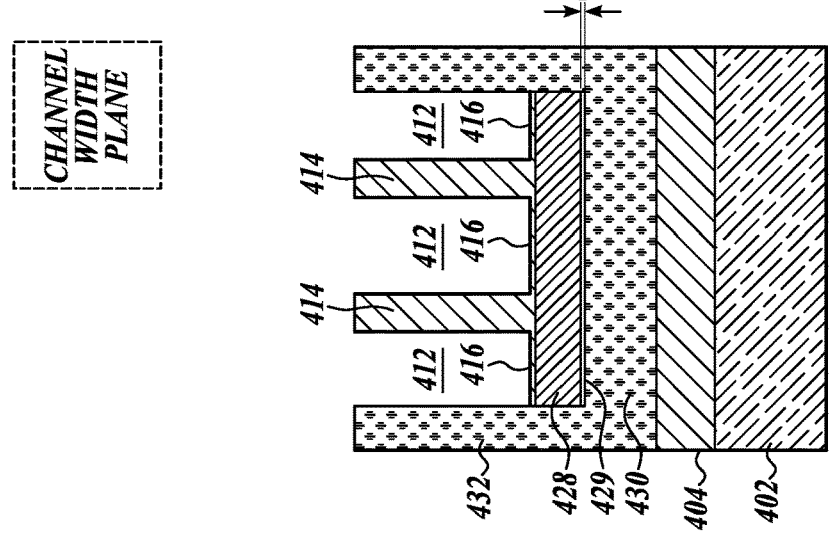
FIG. 4E shows a second portion of another method of fabricating a transistor in accordance with the teachings of the present disclosure.
Figure 4D:
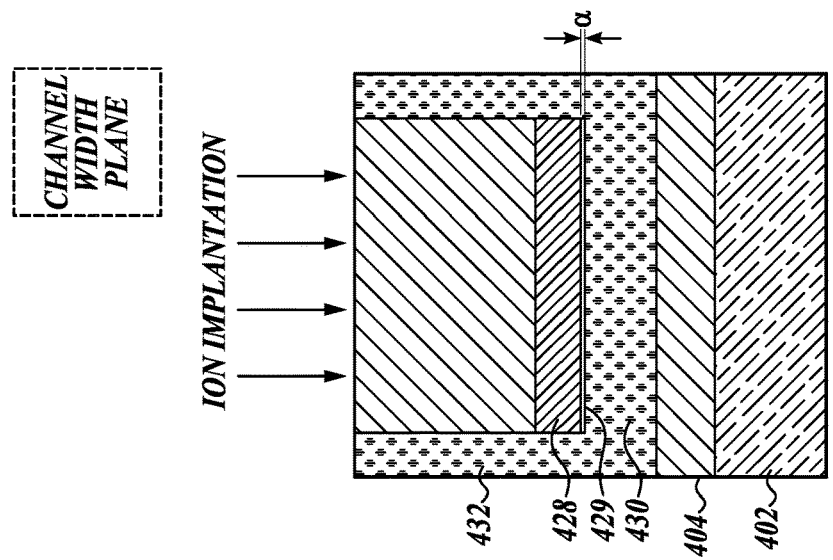
FIG. 4D shows a first portion of another method of fabricating a transistor in accordance with the teachings of the present disclosure.

FIGS. 4D-4F depict one representative method of forming a transistor for an image sensor, such as the source follower transistor of FIG. 3C.

In a first step shown in FIG. 4D, a semiconductor substrate 404 is provided having the features described herein. The provided semiconductor substrate 404 may have a photodiode 402 formed therein, or the photodiode 402 is formed in the semiconductor substrate 404 as part of the first step or in a sequentially next step.

In a second step shown in FIG. 4D, a voltage modulation layer 428 and a passivation layer 430 (including vertical isolation portions 432) are formed in the semiconductor substrate 404. The voltage modulation layer 428 is formed as described above with respect to FIG. 4A. To form the passivation layer 430 and its vertical isolation portions 432, a dopant (e.g., a P-type dopant such as boron) is implanted into the semiconductor substrate 404 between the voltage modulation layer 428 and the photodiode 402, such that it has a layer thickness of 0.5-10.0 nm. In one representative embodiment, a P-type dopant such as boron is implanted into the semiconductor substrate 404 by ion implantation or by diffusing diborane gas, thereby forming the passivation layer 430 and its vertical isolation portions 432, which forms a junction isolation that electrically isolates the photodiode 402 from the voltage modulation layer 428.

In a third step shown in FIG. 4E, a plurality of trenches 412 are formed in the semiconductor substrate 404 as described above with respect to FIG. 4B.

In a fourth step shown in FIG. 4F, an isolation layer 418 is formed as described above with respect to FIG. 4C.

In a fifth step also shown in FIG. 4F, a gate 420 having a plurality of fingers is formed on the isolation layer 418 as described above with respect to FIG. 4C.

Thus, the foregoing methods provide structures that operate as a transistor when a voltage is applied to the gate of the transistor. In particular, the foregoing methods provide transistors with nonplanar electron channels having sidewall portions and base portions in a channel width plane with a uniform threshold voltage, thereby enabling low turn-on voltage and faster device performance. Restated, the base portions and the sidewall portions of the nonplanar electron channel of the transistor can be turned on substantially at the same time when a biasing voltage greater than the uniform threshold voltage applied to the gate of the transistor.

FIGS. 5A and 5B show alternative representative source follower transistors configured to modulate or tune the threshold voltage of different portions of the nonplanar electron channel, such that all portions of the electron channel have approximately the same threshold voltage. Whereas the representative transistors of FIGS. 3A-3C modulate the threshold voltage of the nonplanar electron channel with channel doping using a doped voltage modulation layer disposed in the semiconductor substrate beneath the electron channel, the representative transistors of FIGS. 5A-5B modulate the threshold voltage by utilizing a multi-material gate. It is contemplated that transistors of the present disclosure could have both a voltage modulation layer and a multi-material gate, for even greater control over threshold voltage.

FIG. 5A shows a channel width plane-section view of source follower transistor 508A, which may form part of a pixel (e.g., any of the pixels of FIGS. 2A-2C), which in turn may form part of an image sensor (e.g., the image sensor 100 of FIG. 1). Source follower transistor 508A is similar to the source follower transistors of FIGS. 3A-3C; accordingly, terms used with respect to source follower transistor 508A have alike meanings as alike terms used in connection with other transistors of the present disclosure, except where expressly described. For clarity and simplicity, relevant differences are described below. Although FIGS. 5A and 5B depict a source follower transistor, the structure shown and described is applicable to other transistors, e.g., a reset transistor and a row select transistor.

Source follower transistor 508A is formed in a semiconductor substrate 504, which also includes a photodiode 502 formed therein, e.g., a buried photodiode. The source follower transistor 508A is nonplanar, i.e., it has a plurality of nonplanar structures 514 (e.g., "fins") which are spaced apart by a plurality of base portions 516. An isolation layer 518 is disposed on the nonplanar structures 514 and the base portions 516, and separates the semiconductor substrate 504 from a gate 520.

Channel isolation structures 522 (e.g., shallow channel isolation trench structures) isolate the source follower transistor 508A from the photodiode 502 and other pixel elements.

Gate 520 is a multi-material gate configured to modulate the threshold voltage of different portions of the electron channel, such that all portions of the electron channel have an approximately uniform threshold voltage. Without such a multi-material gate, a voltage modulation layer as described herein, or other threshold voltage modulation means, the nonplanar structures 514 of the source follower transistor 508A would cause different portions of the electron channel to have different threshold voltages. In particular, the base portions 516 would have a higher threshold voltage than sidewall portions of the nonplanar structures 514.

Thus, the multi-material gate 520 is formed of two or more materials, each material having a different work function ("WF"), i.e., each material requiring a different minimum amount of energy needed to remove an electron.

The "fingertips" of the gate 520, i.e., the end portions of the gate fingers disposed adjacent the base portions 516, each comprise a low WF gate portion 540 formed from a relatively low WF gate material, such as titanium carbide (TiC), which in some embodiments is alloyed with Al or Cu. In the example, it is appreciated that the low WF gate portions 540 increase charge carrier mobility in the base portions of the electron channel, and thus reduce threshold voltage necessary to turn on those portions.

Each low WF gate portion 540 has a U-shape in FIG. 5A (i.e., two vertical portions and a recessed horizontal portion therebetween). Each vertical and horizontal portion has a thickness of 0.5 nm-10.0 nm, with each vertical portion extending vertically above the horizontal portion by 0.5 nm-10.0 nm. The bottom horizontal portion of each low WF gate portion 540 is disposed adjacent to one the base portions 516, while each vertical portion is disposed near an edge/corner of the respective nonplanar structure 514, and near a sidewall portion of the electron channel. This U-shape enables fine tuning of the threshold voltage of the base portion of the electron channel, and the portions of the electron channel near the edge/corners of the gate fingers. However, in some embodiments, the low WF gate portions 540 do not have a U-shape. For example, in some embodiments, each low WF gate portion 540 has a rectangular shape with a uniform thickness of 0.5 nm-10.0 nm (when viewed in the channel width plane).

Whereas each low WF gate portion 540 is formed from a relatively low WF gate material, the remaining portion of the gate 520 is a high WF gate portion 542 formed from a relatively high WF gate material (as compared to the relatively low WF gate material). One representative high WF gate material is titanium nitride (TiN), which is appropriate for use when the low WF gate material is TiC. As a result of the different WF materials of the gate 520, charge carrier mobility is greater for the base portions of the electron channel, as compared to the sidewall portions. This effect counteracts the factors that ordinarily cause a higher threshold voltage in the base portions 516, and therefore enabling all portions of the electron channel to have a uniform threshold voltage.

FIG. 5B shows another representative source follower transistor 508B, which is similar to the source follower transistor 508A of FIG. 5A. Accordingly, alike terms and reference numerals are used with respect to both figures. For clarity and simplicity, relevant differences between the source follower transistors of FIG. 5A and FIG. 5B are described below.

The source follower transistor 508B of FIG. 5B has a multi-material gate 520. Whereas the gate 520 of FIG. 5A includes two materials, the gate 520 of FIG. 5B include three materials: a low WF gate material, a high WF gate material, and a conduction material (e.g., a metal or polysilicon).

Like FIG. 5A, low WF gate portions 540 formed of the low WF gate material are formed in the "fingertips" of the gate 520. The low WF gate portions 540 are shown with a recessed shape in the illustrated embodiment, but may have a rectangular (i.e., non-recessed) shape in other embodiments. Thus, the low WF gate portions 540 reduce threshold voltage for the base portions of the electron channel by increasing charge carrier mobility in those locations.

Unlike FIG. 5A, where the high WF gate portion 542 forms substantially on all of the gate 520 except for the low WF gate portions 540, in FIG. 5B, the high WF gate portion 542 is formed as a relatively thin layer adjacent to or at the surfaces of the fingers of the gate 520 (particularly the vertical surfaces). The high WF gate portion 542 has a layer thickness of 0.5 nm-10.0 nm, e.g., 2.0 nm-7.0 nm. Thus, the high WF gate portion 542 forms a serpentine or zigzag shape around the fingers of the gate 520, when viewed in the channel width plane. Consequently, the portion of the gate 520 disposed adjacent to the sidewall portions of the electron channel is formed of the high WF gate material. By reducing charge carrier mobility at these locations, the high WF gate portion 542 effectively increases the threshold voltage for the sidewall portions of the electron channel (but not the base portions of the electron channel, which are disposed adjacent to the low WF gate portions 540).

The remainder of the gate 520 that does not comprise the low WF gate portions 540 or the high WF gate portion 542 is a conductive portion 544 formed of a relatively conductive gate material (e.g., a metal or polysilicon) disposed directly on the high WF gate portion 542. It is advantageous to form the gate 520 as shown in FIG. 5B, i.e., with the high WF gate material disposed around the fingers and the conduction portion 544 formed form a different gate material (but not the remainder of the gate 520), because the advantage of the high WF gate material is greatest around the fingers of the gate 520. Therefore, forming the gate 520 as shown in FIG. 5B can result in greater economy and control over the threshold voltage of the source follower transistor 508.

The source follower transistor 508B of FIG. 5B is also shown with an optional doped passivation layer 530 formed between the electron channel and the photodiode 502. The passivation layer 530 can be utilized with the embodiments of FIG. 5A or 5B, and can have any of the characteristics described above with respect to the passivation layer 330 of FIGS. 3A-3C. Therefore, the passivation layer 530 will not be described again. Thus, the passivation layer 530 advantageously reduces white pixel noise and other deleterious effects, particularly in embodiments such as in FIGS. 5A and 5B, which have a buried photodiode 502. Further, any of the embodiments of FIGS. 5A and 5B can be utilized with a doped voltage modulation layer as described above with respect to FIGS. 3A-3C.

Thus, the source follower transistors 508 of FIGS. 5A and 5B are configured to have a uniform threshold voltage across the electron channel. While the multi-material gate 520 is alone configured to modulate the threshold voltage of the base portions 516 and sidewall portions of the electron channel, the characteristics of the isolation layer 518 (e.g., material and thickness), nonplanar structures 514 (e.g., dimensions), and other aspects of the source follower transistor 508 such as the optional voltage modulation layer also modulate the threshold voltage of portions of the electron channel.

FIGS. 6A-6E depict representative methods of forming a transistor for an image sensor, such as the source follower transistors of FIGS. 5A-5B, row select transistors, reset transistors, and the like.

Figure 6C:
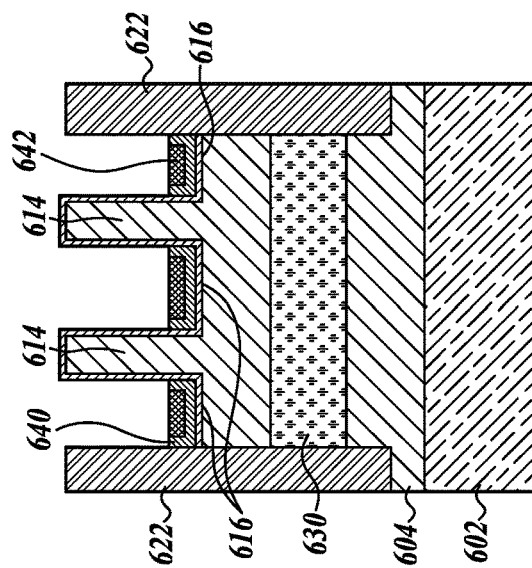
FIG. 6C shows a third portion of a method of fabricating a transistor in accordance with the teachings of the present disclosure.
Figure 6B:
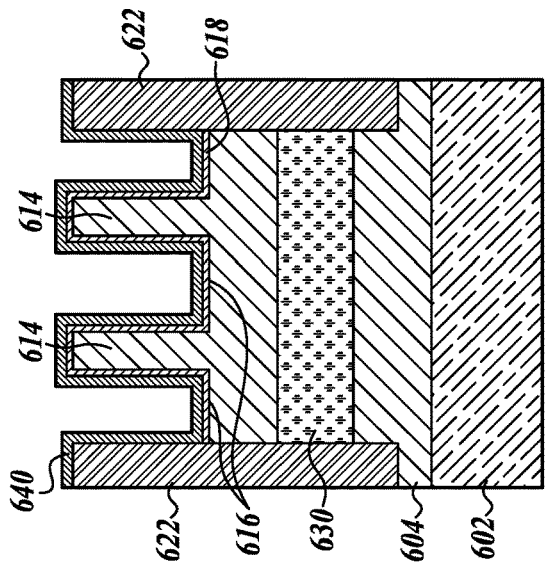
FIG. 6B shows a second portion of a method of fabricating a transistor in accordance with the teachings of the present disclosure.
Figure 6A:
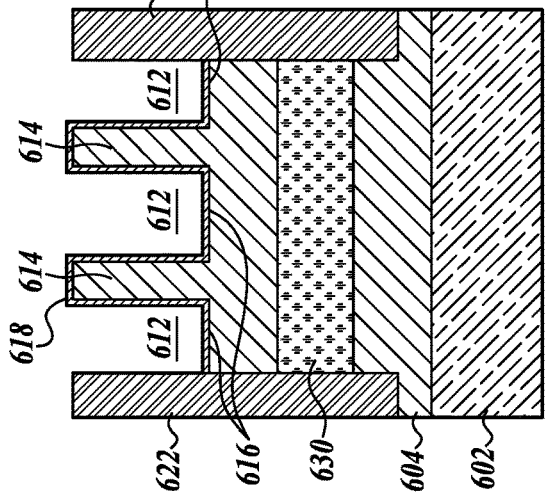
FIG. 6A shows a first portion of a method of fabricating a transistor in accordance with the teachings of the present disclosure.

In a first step shown in FIG. 6A, a semiconductor substrate 604 is provided, having many of the features described herein. The provided semiconductor substrate 604 may have a photodiode 602 formed therein, e.g., a deep buried photodiode. Otherwise, the photodiode 602 is formed in the semiconductor substrate 604 as part of the first step or in a sequentially next step.

In a second optional step also shown in FIG. 6A, channel isolation structures 622 are formed in the semiconductor substrate 604 on opposite sides of an area that will include nonplanar structures and gate, the channel isolation structures 622 each extending in a channel width direction and a channel length direction. The channel isolation structures 622 may be formed by etching trenches in the semiconductor substrate 604 and then filling those trenches with dielectric material e.g., silicon oxide to form shallow channel isolation structures. Following this step, in embodiments having an optional passivation layer 630, the passivation layer 630 is formed in the semiconductor substrate 604, e.g., by implanting a dopant (such as boron) into the semiconductor substrate 604 above the photodiode 602, such that the passivation layer 630 has a layer thickness of 0.5-10.0 nm.

In a third step shown in FIG. 6A, a plurality of trenches 612 are formed in the semiconductor substrate 604 to form nonplanar structures 614 (e.g., fins) and base portions 616. In one representative embodiment, the plurality of trenches 612 are formed using etching and/or photolithography techniques.

In a fourth step shown in FIG. 6A, an isolation layer 618 is formed by depositing a dielectric, such as an oxide or high-k material, conformally on the nonplanar structures 614 and base portions 616 formed in the previous step. In embodiment, a thermal oxidation process is performed to form isolation layer 618.

In a fifth step shown in FIG. 6B, a low WF gate material 640 (e.g., TiC) is deposited on the isolation layer 618 formed in the previous step. In some embodiments having optional channel isolation structures 622 (e.g., shallow channel isolation trench structures), the low WF gate material 640 may deposited over those channel isolation structures 622.

In a sixth step shown in FIG. 6C, the previously-deposited low WF gate material 640 is etched or otherwise removed except in locations adjacent to the base portions 616. That is, the low WF gate material 640 is removed (e.g., using a reduction ion etching (RIE) process) until a 0.5 nm-10.0 nm layer remains adjacent to each base portion 616, thus forming a low WF gate portion that will form the "fingertip" of each finger of the gate. The foregoing step will impart a rectangular shape to each low WF gate portion.

In an optional seventh step shown in FIG. 6C, the low WF gate portion is provided with a U-shape or a recessed shape by first depositing an organic planarization layer, or OPL 642, upon the low WF gate material 640 adjacent to the base portions 616 before removing the low WF gate material 640. The OPL 642 prevents the RIE processes from removing too much of the low WF gate material 640, and preserves two vertical portions and a recessed bottom horizontal portion of the low WF gate material, thus imparting a U-shape. The OPL 642 may be subsequently removed by etching or similar process.

Figure 6E:
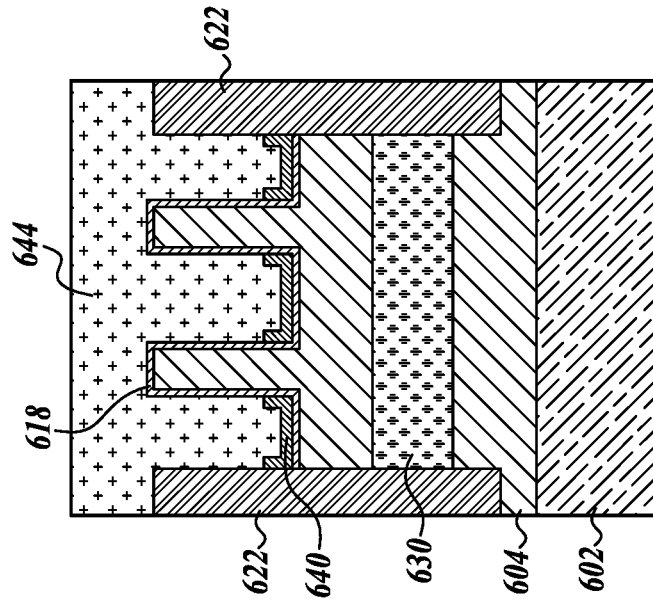
FIG. 6E shows a fifth portion of a method of fabricating a transistor in accordance with the teachings of the present disclosure.
Figure 6D:
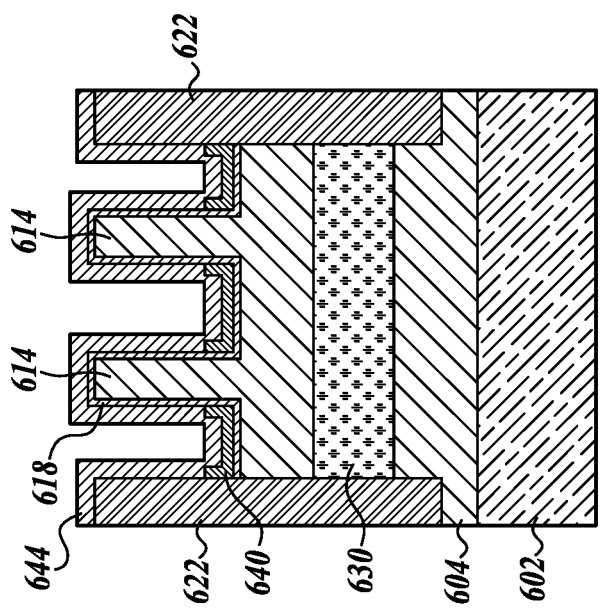
FIG. 6D shows a fourth portion of a method of fabricating a transistor in accordance with the teachings of the present disclosure.

An optional seventh step shown in FIG. 6D is applicable to transistors having the multi-material gate structure as the source follower transistor 508B shown in FIG. 5B. In particular, FIG. 6D shows the formation of an optional high WF gate portion disposed around the nonplanar structures 614 of the semiconductor substrate 604 (as shown in FIG. 5B). A high WF gate material 644, e.g., TiN is deposited upon the isolation layer 618 and the previously-deposited low WF gate material 640, until the high WF gate material 644 has a layer thickness of 1.0 nm-10.0 nm, e.g., 2.0 nm-7.0 nm. Thus, a high WF gate portion is formed.

An eighth step is shown in FIG. 6E. For transistors having the multi-material gate structure as source follower transistor 508A of FIG. 5A, the step of FIG. 6E directly follows the steps shown in FIG. 6C. In particular, a high WF gate material 644 (e.g., TiN) is deposited upon the upon isolation layer 618 and the previously-deposited low WF gate material 640, thereby forming a high WF gate portion that forms the gate for the transistor, except for the "fingertips," which are formed by the previously-deposited low WF gate material 640. A chemical mechanical polishing process is then performed on the deposited high WF gate material 644 in order to polish and planarize the transistor gate, thus completing the multi-material gate.

For transistors having the gate structure as source follower transistor 508B of FIG. 5B, the step of FIG. 6E directly follows the steps shown in FIG. 6D. In particular, a relatively conductive gate material (e.g., a metal or polysilicon) is deposited upon the previously-deposited high WF gate material 644, forming the body of the gate. A chemical mechanical polishing process is then performed on the deposited relatively conductive gate material in order to polish and planarize the transistor gate, thus completing the multi-material gate.

Thus, the present disclosure provides transistors, pixels, image sensors, other electronic devices, and processes for forming the same. Advantageously, the transistors of the present disclosure, e.g., source follower transistors, row select transistors, reset transistors, and other transistors, have structure that modulates the threshold voltage of different portions of the electron channel, such that all portions of the electron channel have a uniform threshold voltage. This advantageously leads to lower turn-on voltage, faster operation speed, higher transconductance, and better device performance.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

Modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

The present application may also reference quantities and numbers. Unless specifically stated, such quantities and numbers are not to be considered restrictive, but representative of the possible quantities or numbers associated with the present application. Ranges of quantities described and claimed herein shall be interpreted as inclusive of the low and high values stated. Also in this regard, the present application may use the term "plurality" to reference a quantity or number. In this regard, the term "plurality" is meant to be any number that is more than one, for example, two, three, four, five, etc. The terms "about," "approximately," "substantially," etc., means plus or minus 5% of the stated value. The term "based upon" means "based at least partially upon".

What is claimed is:

1. A transistor formed in a semiconductor substrate, comprising:
   a plurality of trenches formed in the semiconductor substrate, the plurality of trenches defining, in a channel width plane, a plurality of nonplanar structures and a plurality of base portions of the semiconductor substrate, wherein each of the nonplanar structures comprises a plurality of sidewall portions;
   an isolation layer disposed on the plurality of nonplanar structures and on the plurality of base portions;
   a gate disposed on the isolation layer and extending into the plurality of trenches over the plurality of base portions, wherein the plurality of nonplanar structures and the plurality of base portions form a continuous and uninterrupted structure made of a same material, and wherein the plurality of nonplanar structures and the plurality of base portions form together a nonplanar electron channel; and
   a voltage modulation layer formed as a doped portion of the semiconductor substrate disposed adjacent to the plurality of base portions on an opposite side of the plurality of base portions from the plurality of nonplanar structures, wherein the voltage modulation layer has a dopant type being opposite from that of the semiconductor substrate, wherein the voltage modulation layer is configured to reduce a threshold voltage of portions of the electron channel of the transistor, and wherein the voltage modulation layer is disposed adjacent to the plurality of base portions.

2. The transistor of claim 1, wherein the voltage modulation layer comprises an n-type region formed in a p-type well of the semiconductor substrate.

3. The transistor of claim 2, wherein the n-type region comprises arsenic.

4. The transistor of claim 2, wherein the n-type region has a charge carrier concentration ranging from 1E11/cm3 to 1E13/cm3, inclusive.

5. The transistor of claim 2, further comprising a passivation layer formed as a second doped portion in the semiconductor substrate on an opposite side of the voltage modulation layer from the nonplanar structures.

6. The transistor of claim 5, wherein the passivation layer is adjacent to the voltage modulation layer.

7. The transistor of claim 5, wherein the passivation layer comprises a p-type portion formed in the p-type well of the semiconductor substrate.

8. The transistor of claim 7, wherein the passivation layer extends around opposite sides of the voltage modulation layer in the channel width plane.

9. The transistor of claim 5, wherein the passivation layer is spaced apart from the voltage modulation layer.

10. The transistor of claim 1, wherein the voltage modulation layer has a layer thickness of 0.5 nm-5.0 nm.

11. The transistor of claim 1, wherein the transistor is a source follower transistor, a row select transistor, or a reset transistor.

12. The transistor of claim 1, further comprising a plurality of channel isolation structures formed in the semiconductor substrate on opposite sides of the plurality of nonplanar structures, wherein the voltage modulation layer laterally extends between the plurality of channel isolation structures.

13. The transistor of claim 12, wherein each channel isolation structure is a shallow channel isolation trench structure or a junction isolation structure.

14. The transistor of claim 12, wherein each channel isolation structure extends to a depth into the semiconductor substrate beyond the voltage modulation layer.

15. An image sensor, comprising:
the transistor of claim 1;
a photodiode formed in the semiconductor substrate; and
a transfer transistor coupled to the photodiode and to a floating diffusion, the transfer transistor being operative to transfer image charges from the photodiode to the floating diffusion; and
wherein the transistor of claim 1 is a source follower transistor, and wherein the gate of the source follower transistor is coupled to the floating diffusion.

16. The image sensor of claim 15, wherein the voltage modulation layer comprises an n-type region formed in a p-type well of the semiconductor substrate.

17. The image sensor of claim 15, wherein the voltage modulation layer is formed adjacent to the plurality of base portions of the source follower transistor, and between the plurality of base portions of the source follower transistor and the photodiode.

18. The image sensor of claim 17, further comprising a passivation layer formed as a second doped portion in the semiconductor substrate adjacent to the voltage modulation layer and in between the voltage modulation layer and the photodiode, wherein a first conductive type of the passivation layer is different from a second conductive type of the voltage modulation layer.

19. An image sensor, comprising:
a photodiode formed in a semiconductor substrate;
a transfer transistor coupled to the photodiode and to a floating diffusion, the transfer transistor being operative to transfer image charges from the photodiode to the floating diffusion; and
a transistor formed in the semiconductor substrate, wherein the transistor is a source follower transistor, and wherein a gate of the source follower transistor is coupled to the floating diffusion, the transistor comprising:
a plurality of trenches formed in the semiconductor substrate, the plurality of trenches defining, in a channel width plane, a plurality of nonplanar structures and a plurality of base portions of the semiconductor substrate, wherein each of the nonplanar structures comprises a plurality of sidewall portions;
an isolation layer disposed on the plurality of nonplanar structures and on the plurality of base portions;
a gate disposed on the isolation layer and extending into the plurality of trenches; and
a voltage modulation layer formed as a doped portion of the semiconductor substrate disposed adjacent to the plurality of base portions on an opposite side of the plurality of base portions from the plurality of nonplanar structures,
the image sensor further comprising a plurality of channel isolation structures formed in the semiconductor substrate on opposite sides of the plurality of nonplanar structures, wherein one of the plurality of channel isolation structures is formed in between the photodiode and the source follower transistor, wherein the voltage modulation layer laterally extends between the plurality of channel isolation structures.

20. The image sensor of claim 19, wherein the voltage modulation layer has a dopant type being opposite from that of the semiconductor substrate.

21. A transistor formed in a semiconductor substrate, comprising:
a plurality of trenches formed in the semiconductor substrate, the plurality of trenches defining, in a channel width plane, a plurality of nonplanar structures and a plurality of base portions of the semiconductor substrate, wherein each of the nonplanar structures comprises a plurality of sidewall portions, and wherein the plurality of nonplanar structures and the plurality of base portions form a continuous and uninterrupted structure made of a same material;
an isolation layer disposed on the plurality of nonplanar structures and on the plurality of base portions;
a gate disposed on the isolation layer and extending into the plurality of trenches on the plurality of base portions; and
a voltage modulation layer formed as a doped portion of the semiconductor substrate disposed beneath the plurality of trenches on an opposite side of the plurality of base portions from the plurality of nonplanar structures, wherein the voltage modulation layer has a dopant type being opposite from that of the semiconductor substrate to reduce a threshold voltage of portions of an electron channel of the transistor.

* * * * *